United States Patent
Kondo (10) Patent No.: US 7,570,149 B2
(45) Date of Patent: Aug. 4, 2009

(54) ELECTRONIC CIRCUIT DEVICE INCLUDING ELECTRIC ELEMENT AND VARISTOR ON SUBSTRATE AND ITS MANUFACTURE METHOD

(75) Inventor: Masao Kondo, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 493 days.

(21) Appl. No.: 11/214,894

(22) Filed: Aug. 31, 2005

(65) Prior Publication Data

US 2006/0262477 A1  Nov. 23, 2006

(30) Foreign Application Priority Data

May 23, 2005 (JP) .............................. 2005-149729

(51) Int. Cl.
  *H01C 7/10* (2006.01)
(52) U.S. Cl. .......................................... 338/20; 333/193
(58) Field of Classification Search .................. 338/20; 333/193–196, 150–153
  See application file for complete search history.

(56) References Cited

U.S. PATENT DOCUMENTS 3,916,366 A  10/1975 Jefferson
5,699,026 A  12/1997 Kurp et al.

2004/0087286 A1  5/2004 Inoue et al.

FOREIGN PATENT DOCUMENTS

| | | |
|---|---|---|
| DE | 196 31 745 C1 | 10/1997 |
| EP | 0 703 188 A1 | 3/1996 |
| JP | 58-000163 A | 1/1983 |
| JP | 05-273596 | 10/1993 |
| JP | 5-299210 | 11/1993 |
| JP | 09-283707 A | 10/1997 |
| JP | 10-032105 A | 2/1998 |
| JP | 2912081 | 4/1999 |
| JP | 11-158611 | 6/1999 |
| JP | 2004-72584 | 3/2004 |

OTHER PUBLICATIONS

European Search Report Application No. 05255158.7-2214 dated Sep. 7, 2006.
Partial European Search Report Application No. 06021811.2-2214 dated Jul. 23, 2007.
European Patent Office communication dated Mar. 25, 2009 in counterpart Application No. 05255158.7.

*Primary Examiner*—Kyung Lee
(74) *Attorney, Agent, or Firm*—Westerman, Hattori, Daniels & Adrian, LLP.

(57) ABSTRACT

An electronic element having at least a pair of electrodes is formed on a substrate. A varistor element is formed on the substrate, the varistor element including a pair of electrodes and a varistor insulating film. When a surge voltage is applied across the pair of electrodes of the varistor element, a surge current flows through the varistor insulating film. One electrode of the varistor element is connected to one electrode of the electronic element, and the other electrode of the varistor element is connected to the other electrode of the electronic element.

7 Claims, 7 Drawing Sheets

ELECTRONIC CIRCUIT DEVICE INCLUDING ELECTRIC ELEMENT AND VARISTOR ON SUBSTRATE AND ITS MANUFACTURE METHOD

CROSS REFERENCE TO RELATED APPLICATION

This application is based on and claims priority of Japanese Patent Application No. 2005-149729 filed on May 23, 2005, the entire contents of which are incorporated herein by reference.

BACKGROUND OF THE INVENTION

A) Field of the Invention

The present invention relates to an electronic circuit device and its manufacture method, and more particularly to an electronic circuit device having a countermeasure against a surge voltage and its manufacture method. The present invention relates also to a manufacture method for a varistor suitable for application to an electronic circuit device and to a manufacture method for a semiconductor device having a varistor.

B) Description of the Related Art

Malfunction caused by electrostatic surges and noises is becoming an important issue as a drive frequency of electronic components becomes high. Electronic components, typically dielectric filters and surface acoustic wave (SAW) filters having piezoelectric material, are likely to generate electrostatic surges because these components have piezoelectric effect that voltage is generated upon application of a stress.

In a high frequency device disclosed in JP-A-2004-72584, a varistor is mounted between an antenna terminal and a SAW filter to protect the electronic circuit from electrostatic surges. By mounting a varistor, it is possible to provide a countermeasure against electrostatic surges of an electronic circuit board on which a SAW filter is mounted.

Japanese Patent No. 2912081 discloses a varistor using a strontium titanate thin film. According to this invention disclosed in Japanese Patent No. 2912081, a titanium film is subjected to a hydrothermal process in aqueous solution containing strontium ions to form a strontium titanate film having high crystallinity.

An electronic circuit board having a SAW filter mounted thereon is provided with an electrostatic surge countermeasure by mounting a varistor. However, a SAW filter itself is not provided with the electrostatic surge countermeasure. Namely, a worker handling each component on the substrate is not provided with the electrostatic surge countermeasure. Therefore, the worker feels uncomfortable shocks of electrostatic surges in some cases.

SUMMARY OF THE INVENTION

An object of the present invention is to provide an electronic circuit device whose component itself is provided with an electrostatic surge countermeasure and is safe to a worker handling each component, and its manufacture method. Another object of the present invention is to provide a manufacture method for a varistor applicable to the electronic circuit device. Still another object of the present invention is to provide a manufacture method for a semiconductor device using the varistor.

According to one aspect of the present invention, there is provided an electronic circuit device comprising: an electronic element formed on a substrate and having at least a pair of electrodes; and a varistor element formed on the substrate and including a pair of electrodes and a varistor insulating film, the varistor element flowing a surge current via the varistor insulating film upon application of a surge voltage across the pair of electrodes, one electrode of the varistor element being connected to one of the electrodes of the electronic element and the other electrode of the varistor element being connected to the other of the electrodes of the electronic element.

According to another aspect of the present invention, there is provided a manufacture method for an electronic circuit device comprising steps of: (a) preparing a substrate having at least a surface layer made of piezoelectric material; (b) forming a conductive film of conductive material on the substrate; (c) patterning the conductive film to form a pair of interdigital transducer electrodes interdigitated with each other and a pair of varistor electrodes respectively continuous with the pair of interdigital transducer electrodes; (d) forming a varistor insulating film covering an area from an upper surface of one of the pair of varistor electrodes to an upper surface of the other of the pair of varistor electrodes; and (e) forming an upper conductive film on the varistor insulating film facing both of the varistor electrodes via the varistor insulating film, wherein when a surge voltage is applied across the pair of varistor electrodes, a surge current flows through the varistor insulating film and the upper conductive film.

According to still another aspect of the present invention, there is provided a varistor manufacture method comprising steps of: (a) forming a lower conductive film of aluminum on a substrate; (b) forming a varistor insulating film of aluminum oxide by oxidizing a surface layer of the lower conductive film; and (c) forming an upper conductive film of conductive material on the varistor insulating film.

According to still another aspect of the present invention, there is provided a semiconductor device manufacture method comprising steps of: (a) forming a semiconductor element having at least a pair of terminals on a semiconductor substrate; (b) forming an interlayer insulating film on the substrate, the interlayer insulating film covering the semiconductor element; and (c) forming a varistor element on the interlayer insulating film, the varistor element including a pair of electrodes and a varistor insulating film, at least one of the pair of electrodes being electrically connected to one terminal of the semiconductor element, the varistor element flowing a surge current through the varistor insulating film upon application of a surge voltage across the pair of electrodes of the semiconductor element.

By forming also a varistor element on the substrate on which an electronic element is formed, even a discrete electronic circuit device can lower instantaneously a surge voltage applied across the pair of electrodes of the electronic element.

DESCRIPTION OF THE PREFERRED EMBODIMENTS

Figure 1A:
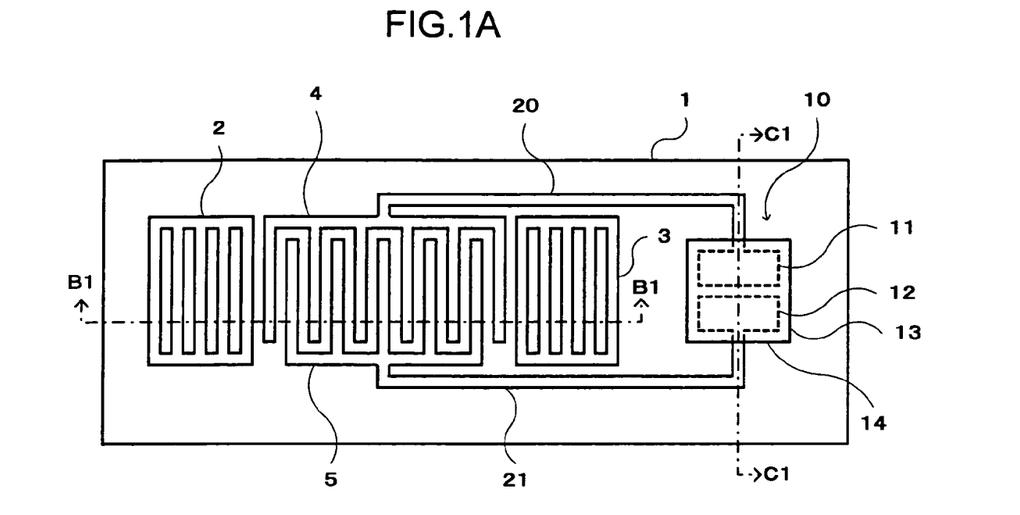
FIG. 1A is a plan view of an electronic circuit device according to a first embodiment.
Figure 1B:
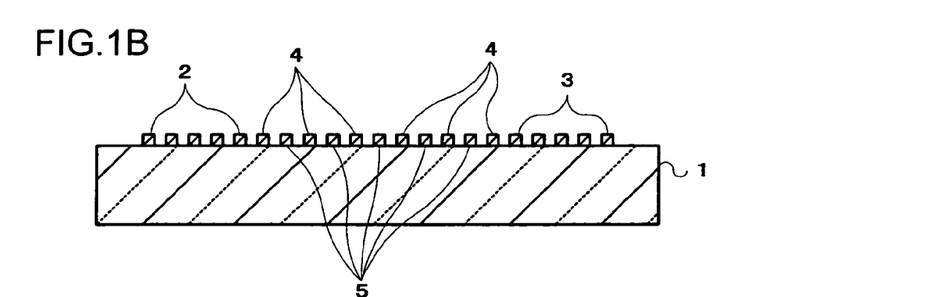
FIGS. 1B and 1C are cross sectional views of the electronic circuit device.
Figure 1C:
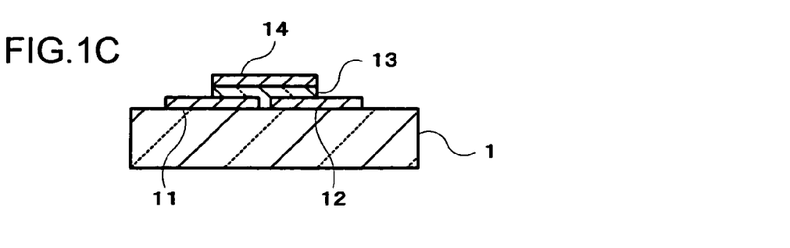

FIG. 1A is a plan view of an electronic circuit device according to the first embodiment, and FIGS. 1B and 1C are cross sectional views taken along one-dot chain line B1-B1 and one-dot chain line C1-C1 of FIG. 1, respectively. On the surface of a substrate 1 made of lithium tantalate ($LiTaO_3$), a pair of interdigital transducer electrodes 4 and 5 interdigitated with each other is formed. Reflectors 2 and 3 are formed on opposite ends of a path along which a surface acoustic wave excited by the interdigital transducer electrodes 4 and 5 propagates.

Each of the reflectors 2 and 3 is constituted of a plurality of conductive patterns extending in a direction perpendicular to a propagation direction of the surface acoustic wave. These conductive patterns are electrically shorted. The surface acoustic wave excited by the interdigital transducer electrodes 4 and 5 and propagating toward opposite sides is reflected by the reflectors 2 and 3. Therefore, a standing wave is generated between the paired reflectors 2 and 3. The interdigital transducer electrodes 4 and 5 and reflectors 2 and 3 constitute a SAW resonator.

A varistor element 10 is formed on the surface of the substrate 1. The varistor element 10 is constituted of varistor electrodes 11 and 12, a varistor insulating film 13 and an upper conductive film 14. The varistor electrodes 11 and 12 are disposed being spaced apart from each other by a gap in an in-plane direction.

The varistor insulating film 13 is made of strontium titanate and covers the area from the upper surface of one varistor electrode 11 to the upper surface of the other varistor electrode 12 via the gap. A thickness of the varistor insulating film 13 is, for example, 150 nm. The upper conductive film 14 has a two-layer structure stacking a platinum (Pt) film and a titanium (Ti) film in this order from the substrate side.

One varistor electrode 11 is connected to one interdigital transducer electrode 4 by a wiring 20, and the other varistor electrode 12 is connected to the other interdigital transducer electrode 5 by a wiring 21. Each of the reflectors 2 and 3, interdigital transducer electrodes 4 and 5, varistor electrodes 11 and 12, and wirings 20 and 21 has a three-layer structure of a copper (Cu) film sandwiched between aluminum-copper (Al—Cu) alloy films.

Figure 1D:
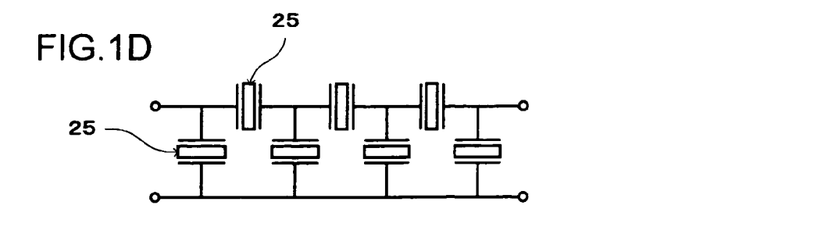
FIG. 1D is an equivalent circuit diagram of a filter having electronic circuit devices of the first embodiment connected in a ladder shape.

FIG. 1D is an equivalent circuit diagram of a filter using SAW resonators shown in FIGS. 1A to 1C. Seven SAW resonators 25 in total are disposed in a ladder shape. Each SAW resonator 25 utilizes a standing wave, which has less attenuation than a traveling wave. Therefore, a low less filter can be obtained than a conventional SAW filter utilizing a traveling wave.

Next, with reference to FIGS. 2A to 2E, description will be made on a manufacture method for an electronic circuit device according to the first embodiment. In each of FIGS. 2A to 2E, a left side cross sectional view shows the interdigital transducer electrodes and a right side shows a varistor element.

Figure 2A:
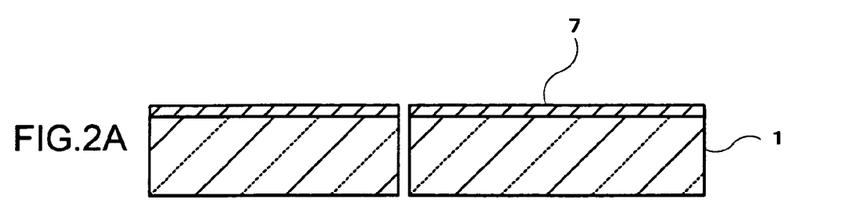
FIGS. 2A to 2D are cross sectional views of the electronic circuit device during intermediate manufacture processes illustrating a manufacture method for the electronic circuit device of the first embodiment.
Figure 2B:
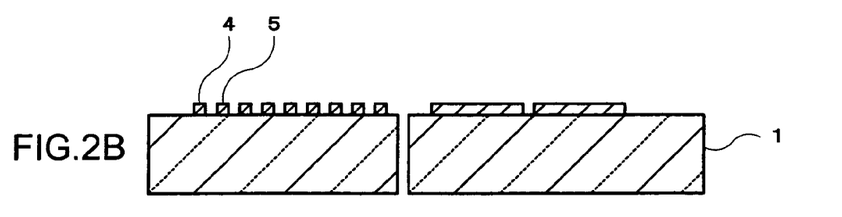

As shown in FIG. 2A, on the surface of a substrate 1 made of polarized $LiTaO_3$, a conductive film 7 is formed by sputtering. The conductive film has a three-layer structure stacking an Al—Cu alloy layer, a Cu layer and an Al—Cu alloy layer in this order from the substrate side. As shown in FIG. 2B, the conductive film 7 is patterned by using well-known photolithography techniques to form interdigital transducer electrodes 4 and 5 and varistor electrodes 11 and 12. Although not shown in the cross sectional views of FIG. 2B, the reflectors 2 and 3 and wirings 20 and 21 shown in FIG. 1A are formed at the same time. A composite substrate whose surface layer is made of piezoelectric material may be used as the substrate 1.

Figure 2C:
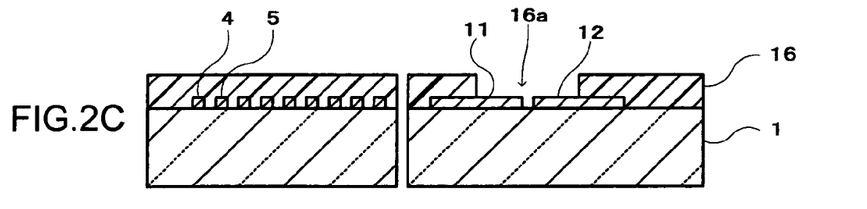

As shown in FIG. 2C, a photoresist film 16 is formed on the whole substrate surface, covering the interdigital transducer electrodes 4 and 5 and varistor electrodes 11 and 12. The photoresist film 16 is partially exposed and developed to form an opening 16a. The opening 16a has a planar shape fitting the varistor insulating film 13 shown in FIG. 1A.

Figure 2D:
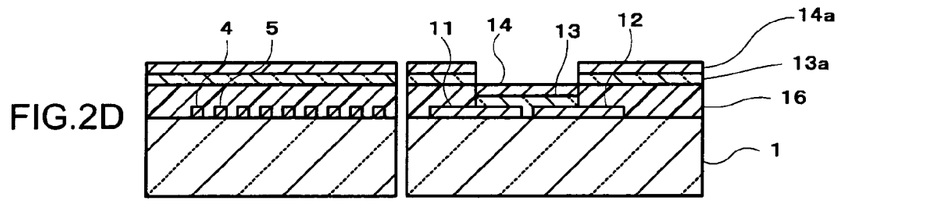

As shown in FIG. 2D, a varistor insulating film 13 of strontium titanate and an upper conductive film 14 are formed on the bottom of the opening 16a by sputtering. The upper conductive film 14 has a two-layer structure of a platinum layer and a titanium layer stacked in this order from the bottom. Also on the upper surface of the photoresist film 16, a strontium titanate film 13a and a two-layer structure 14a of the platinum layer and titanium layer are deposited. These films and layers are formed without positively heating the substrate 1.

Figure 2E:
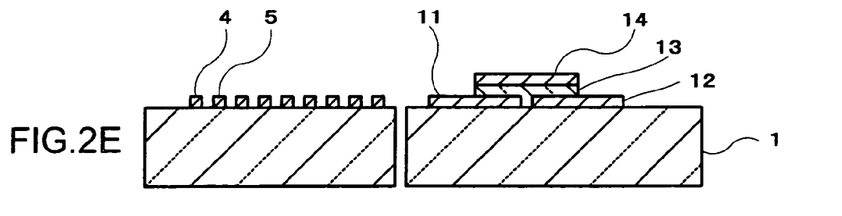
FIG. 2E is a cross sectional view of the final electronic circuit device.

As shown in FIG. 2E, the photoresist film 16 is removed. At this time, the strontium titanate film 13a and the two-layer structure 14a of the platinum layer and titanium layer deposited on the photoresist film 16 are lifted off.

According to the manufacture method of the first embodiment, the varistor insulating film 13 is formed approximately at room temperature without positively heating the substrate 1. Therefore, the polarization characteristics of the polarized substrate 1 are not degraded. The varistor electrodes 11 and 12, varistor insulating film 13, and upper conductive film 14 function as the varistor element 10.

Next, with reference to FIGS. 3A and 3B and FIG. 4, description will be made on the characteristics of a varistor element using strontium titanate as the material of the varistor insulating film.

Figure 3A:
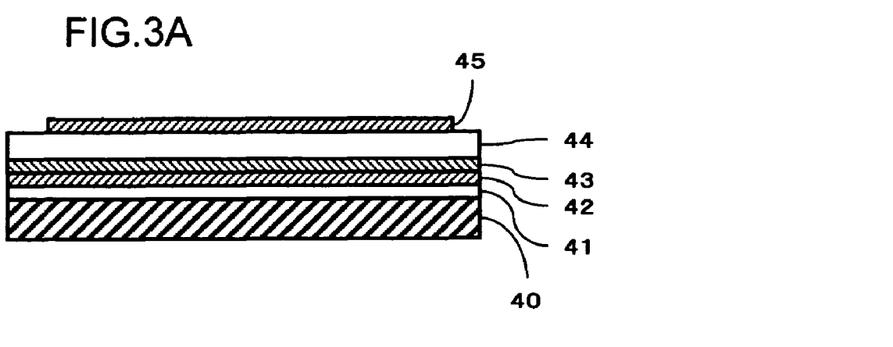
FIG. 3A is a cross sectional view of an evaluation sample and FIG. 3B is a graph showing an X-ray diffraction pattern of the evaluation sample.

FIG. 3A is a cross sectional view of a varistor element manufactured to evaluate the varistor characteristics. A surface of a silicon substrate 40 was thermally oxidized to form a silicon oxide film 41 having a thickness of 100 nm. A titanium film 42 having a thickness of 60 nm and a platinum film 43 having a thickness of 200 nm were formed on the silicon oxide film 41 by sputtering. The titanium film 42 and platinum film 43 were formed by sputtering respectively a titanium target and a platinum target by argon plasma, without heating the substrate 40. A pressure in a film forming chamber was set to about 1 Pa (7.5 mTorr).

A strontium titanate film 44 was formed on the platinum film 43 by sputtering. Argon and oxygen were used as sputtering gas at flow rates of 30 sccm and 7.5 sccm, respectively. A pressure in a film forming chamber was set to 1 Pa. Samples of three types having different film thicknesses were manufactured at film forming times of 1, 3 and 5 hours.

A platinum film 45 was formed on the strontium titanate film 44 by electron beam evaporation through a metal mask having an opening. A thickness of the platinum film 45 was about 100 nm.

Figure 3B:
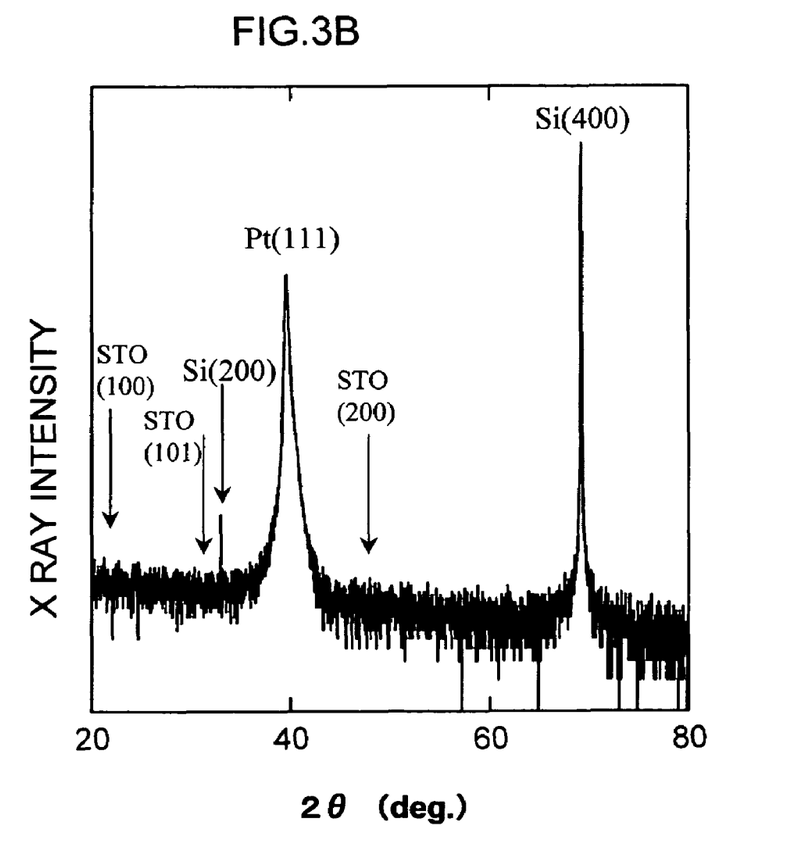

FIG. 3B shows an X-ray diffraction pattern of a sample manufactured by setting a time for forming a strontium titanate film to 3 hours. Peaks appear corresponding to the (2 0 0) and (4 0 0) planes of a silicon substrate 40 and the (1 1 1) plane of platinum, and no peak appears corresponding to strontium titanate. It can be understood from this result that the strontium titanate film formed by sputtering at a room temperature is amorphous.

Figure 4:
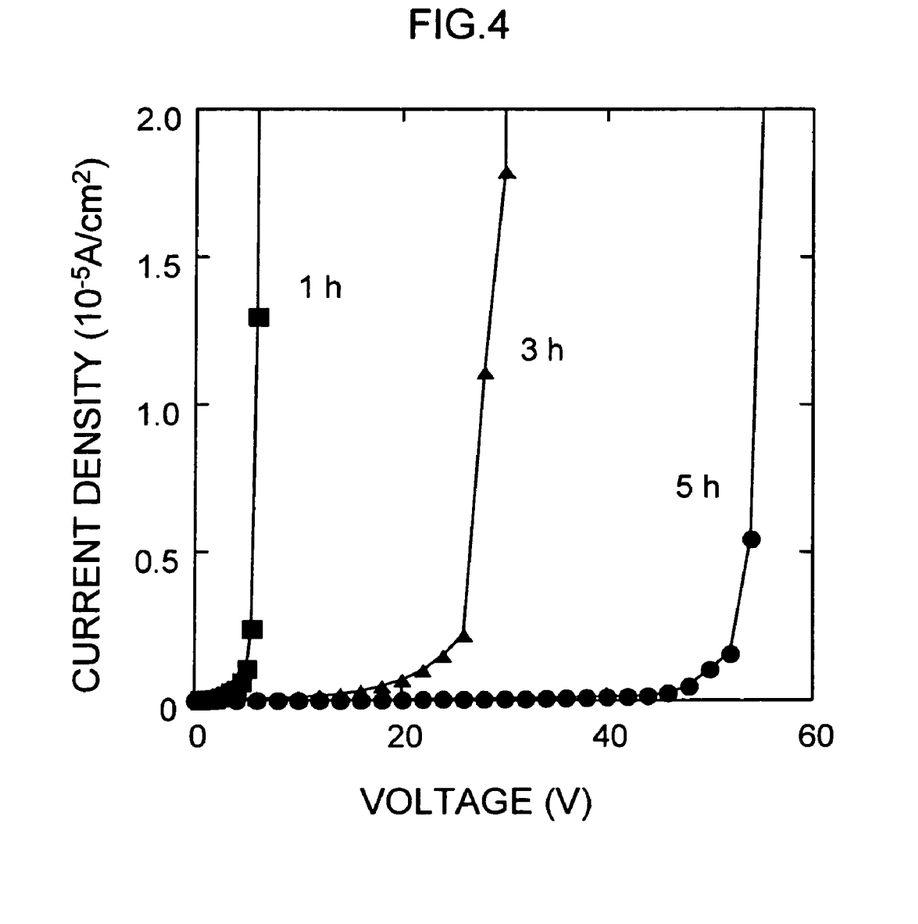
FIG. 4 is a graph showing current-voltage characteristics of the evaluation sample shown in FIG. 3A.

FIG. 4 shows current-voltage characteristics of the sample shown in FIG. 3A. The abscissa represents a voltage in the unit of "V" and the ordinate represents a current density in the unit of "$10^{-5}$ A/cm$^2$". Square, triangle and circle symbols in FIG. 4 indicate current densities of samples whose strontium titanate films 44 are formed in 1, 3 and 5 hours, respectively. All the samples show nonlinear current-voltage characteristics, current will not flow substantially in a range smaller than some threshold voltage, and current starts flowing abruptly when the applied voltage becomes the threshold voltage or higher. When a voltage was lowered to a value smaller than the threshold voltage after the voltage equal to or higher than the threshold voltage was applied to flow a current, the state was returned to the initial state not flowing a current. It can be understood that the sample shown in FIG. 3A can function as a varistor element for flowing a surge current when a surge voltage is applied.

It can be understood that the threshold voltage depends on a time for forming the strontium titanate film, i.e., its film thickness. It is therefore possible to adjust a threshold voltage by changing a film thickness of the strontium titanate film 44.

The reason, why the nonlinear current-voltage characteristics shown in FIG. 4 are obtained by using an amorphous strontium titanate film, may be ascribed to the following.

Since the strontium titanate film is not crystallized, it can be considered that positive and negative ions are not disposed regularly at lattice points and there is fluctuation in density of positive and negative ions. Negative ions in particular are ions of gas elements at an ordinary temperature so that the films are likely to have non-stoichiometric composition. An oxygen excessive region is likely to have a p-type conductivity and an oxygen insufficient region is likely to have an n-type conductivity. These are the reason of the non-linear current-voltage characteristics.

Next, with reference to FIG. 5, description will be made on a manufacture method for an electronic circuit device according to the second embodiment.

Figure 5A:
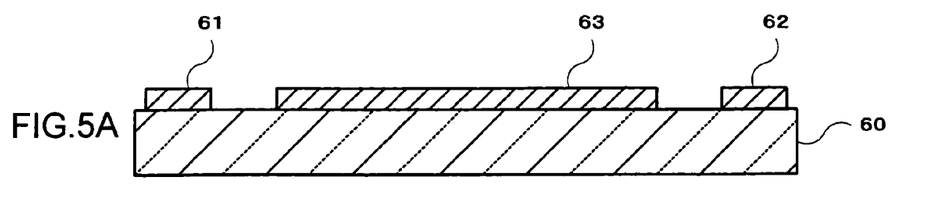
FIGS. 5A to 5D are cross sectional views of an electronic circuit device according to a second embodiment during intermediate manufacture processes.

As shown in FIG. 5A, on the surface of a substrate 60 having an insulating surface, aluminum having a purity of 99.99% is deposited by electron beam evaporation to form an aluminum film having a thickness of 500 nm. This aluminum film is patterned by photolithography to form a lower electrode 63 and pads 61 and 62.

Figure 5B:
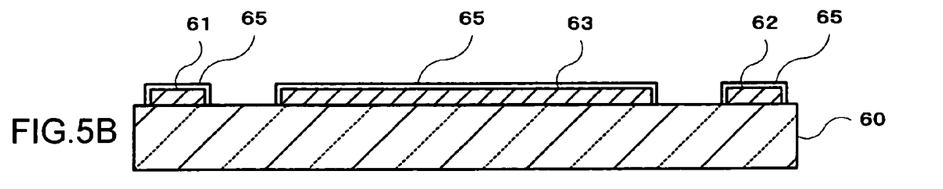

As shown in FIG. 5B, an aluminum oxide film 65 is formed on the surfaces of the lower electrode 63 and pads 61 and 62. The aluminum oxide film 65 is formed by placing the substrate in the atmospheric air for 24 hours to naturally oxidize the surface of the aluminum. Under this condition, a thickness of the aluminum oxide film 65 is about 3 nm.

Figure 5C:
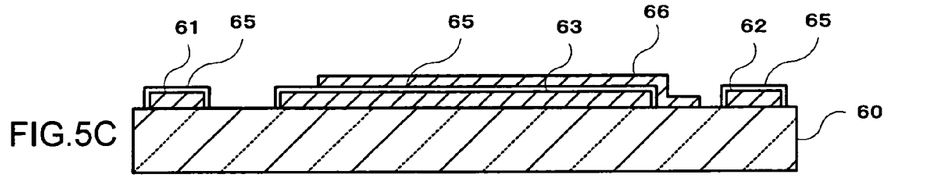

As shown in FIG. 5C, an upper electrode 66 is formed partially covering the lower electrode 63. The upper electrode 66 is formed by depositing aluminum by electron beam evaporation through a metal mask having an opening. A thickness of the upper electrode 66 is, for example, 500 nm.

Figure 5D:
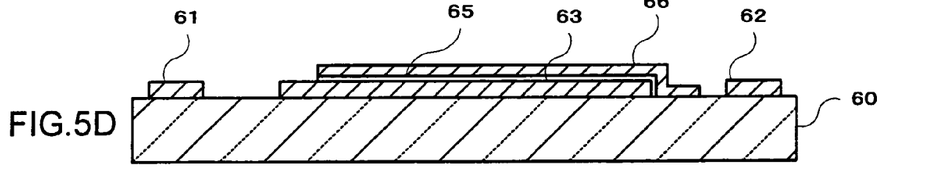

As shown in FIG. 5D, the exposed partial region of the aluminum oxide film 65 covering the pads 61 and 62 and the aluminum oxide film 65 covering the lower electrode 63 is etched by a dry etching process. The aluminum oxide film 65 may be scratched mechanically to partially expose the underlying metal aluminum film.

Figure 5E:
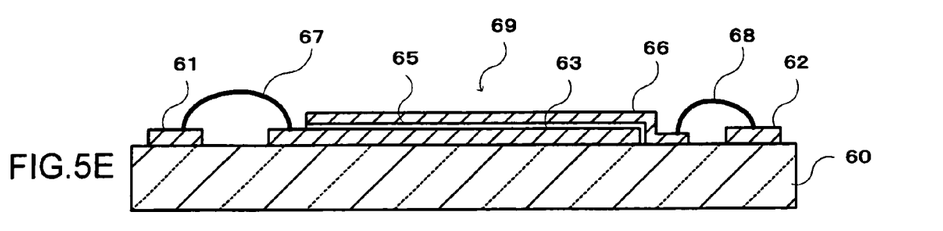
FIG. 5E is a cross sectional view of the final electronic circuit device.

As shown in FIG. 5E, the one pad 61 and lower electrode 63 are connected by a wire 67 and the other pad 62 and upper electrode 66 are connected by a wire 68.

The lower electrode 63, aluminum oxide film 65 and upper electrode 66 constitute a varistor element 69.

Figure 6:
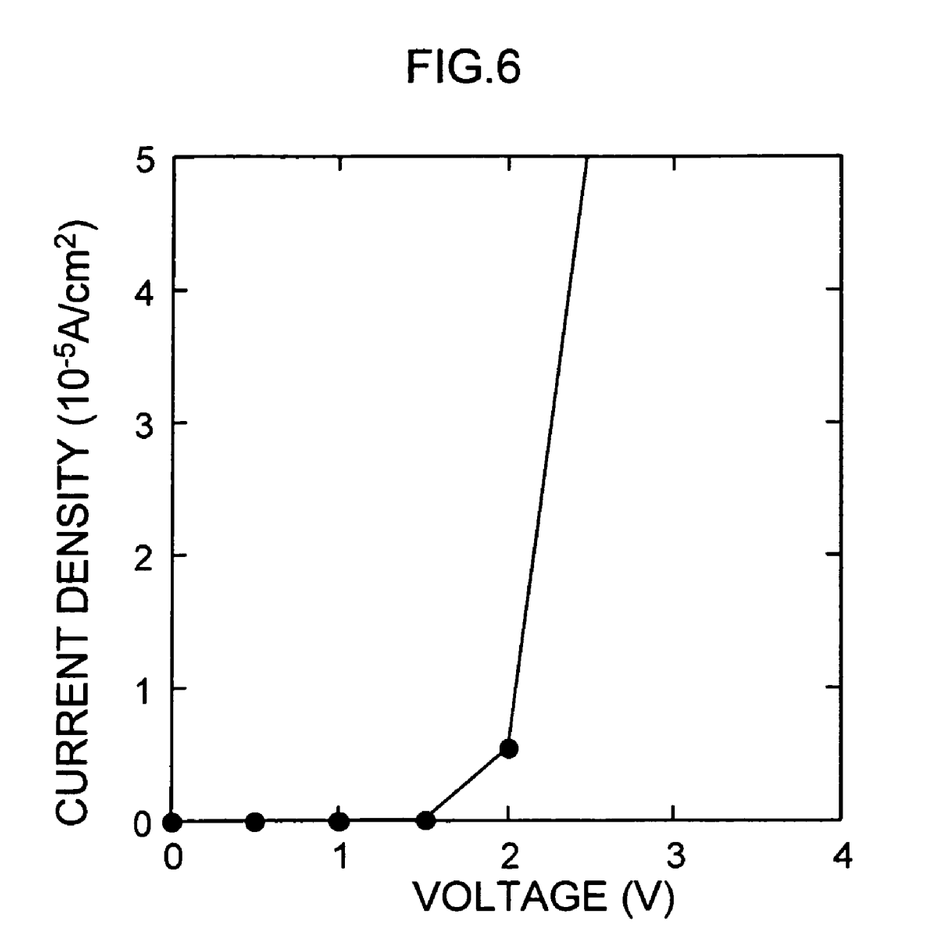
FIG. 6 is a graph showing current-voltage characteristics of a varistor element used in the electronic circuit device of the second embodiment.

FIG. 6 shows current-voltage characteristics of the varistor element 69 shown in FIG. 5E. The abscissa represents a voltage in the unit of "V" and the ordinate represents a current density in the unit of "$10^{-5}$ A/cm$^2$". Nonlinear current-voltage characteristics are obtained and it can be understood that this device functions as a varistor element. Similar characteristics were obtained even if the polarity of an applied voltage was reversed and the current-voltage characteristics generally symmetrical to the characteristics shown in FIG. 6 were obtained.

The aluminum oxide film 65 used as the varistor insulating film of the electronic circuit device of the second embodiment is amorphous as well as the first embodiment. It can be considered that the nonlinear current-voltage characteristics are obtained from the same reason as that in the first embodiment.

In the second embodiment, the aluminum oxide film is formed by naturally oxidize the surface of the aluminum film to form. The aluminum oxide film may be formed by other methods. For example, the substrate may be immersed in boiled pure water, the surface of the aluminum film may be subjected to a chemical conversion treatment by using chromate or the like, or alumite treatment (anodic oxidation) to the surface of the aluminum film may be performed. By oxidizing the surface of the aluminum film by these methods, a thicker aluminum oxide film can be formed in a shorter time, as compared to natural oxide. With the alumite treatment, an aluminum oxide film having a thickness of 10 µm or thicker can be formed easily. By making the aluminum oxide film thicker, the threshold voltage of a varistor element can be made higher.

Figure 7:
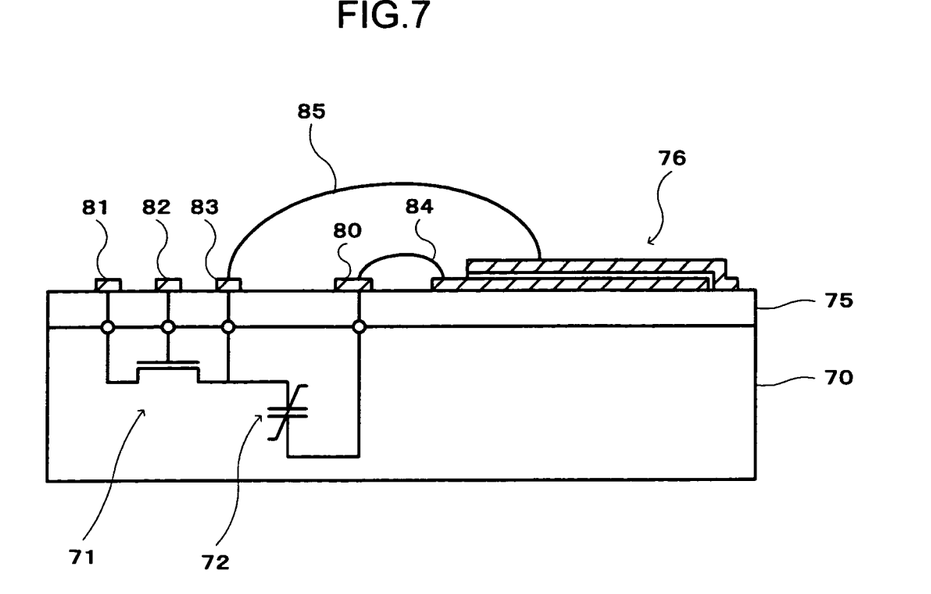
FIG. 7 is a schematic diagram of an electronic circuit device according to a third embodiment.

FIG. 7 is a schematic diagram of an electronic circuit device according to the third embodiment. On the surface of a semiconductor substrate 70, a ferroelectric RAM (FRAM) of one-transistor one-capacitor type is formed. One memory cell of FRAM is constituted of a MOS transistor 71 and a ferroelectric capacitor 72. The source of the MOS transistor 71 is connected to one electrode of the ferroelectric capacitor 72.

Description will be made on a manufacture method for an electronic circuit device according to the third embodiment. An interlayer insulating film 75 of silicon oxide is formed on a substrate 70, covering a memory cell of FRAM. Via holes are formed in the interlayer insulating film 75 at positions corresponding to the drain and gate of the MOS transistor 71, at a position corresponding to an interconnection point between the source of the MOS transistor 71 and one electrode of the ferroelectric capacitor 72, and at a position corresponding to the other electrode of the ferroelectric capacitor 72.

A varistor element 76 and pads 80, 81, 82 and 83 are formed on the interlayer insulating film 75 by the same method as the second embodiment shown in FIG. 5A to 5E. The pads 81 and 82 are connected to the drain and gate of the MOS transistor 71. The pad 83 is connected to the interconnection point between the one electrode of the ferroelectric capacitor 72 and the source of the MOS transistor 71. The pad 80 is connected to the other electrode of the ferroelectric capacitor 72. The lower electrode of the varistor element 76 is connected to the pad 80 by a wire 84. The upper electrode of the varistor element 76 is connected to the pad 83 by a wire 85.

A ferroelectric film of the ferroelectric capacitor 76 generally demonstrates piezoelectricity as well as ferroelectricity. As a stress is applied to the ferroelectric film of the ferroelectric capacitor 72, a voltage is generated due to the piezoelectric effect. By providing the varistor element 76, a surge voltage generated by the piezoelectric effect can be lowered instantaneously.

In the above embodiments, only one varistor element is connected between the electrodes having a generation possibility of a surge voltage. Varistor elements may be disposed in an array to serially or parallely connect a plurality of varistor elements.

In the above embodiments, although strontium titanate or aluminum oxide is used as the material of the varistor insulating film, other amorphous oxides may also be used. For example, barium titanate, zinc oxide or the like may be used. A thickness of the varistor insulating film is preferably set to 1 μm or thinner in order not to apply uncomfortable shocks caused by a surge voltage to workers. A lower limit of the thickness of the varistor insulating film is set properly in accordance with an operation voltage of each electronic circuit device. However, the thickness is set preferably to 3 nm or thicker by considering a manufacture yield.

The present invention has been described in connection with the preferred embodiments. The invention is not limited only to the above embodiments. It will be apparent to those skilled in the art that other various modifications, improvements, combinations, and the like can be made.

I claim:

1. An electronic circuit device comprising:
   an electronic element formed on a substrate and having at least a pair of electrodes; and
   a varistor element formed on the substrate and including a pair of electrodes and a varistor insulating film, the varistor element flowing a surge current via the varistor insulating film upon application of a surge voltage across the pair of electrodes, one of the electrodes of the varistor element and one of the electrodes of the electronic element being connected to each other and being formed by patterning a same conductive film and the other of the electrodes of the varistor element being connected to the other of the electrodes of the electronic element.

2. The electronic circuit device according to claim 1, wherein the varistor insulating film is amorphous oxide.

3. The electronic circuit device according to claim 1, wherein the varistor insulating film is made of strontium titanate, barium titanate, zinc oxide or aluminum oxide.

4. The electronic circuit device according to claim 1, wherein the electronic element includes a piezoelectric member made of piezoelectric material, and the pair of electrodes of the electronic element is formed on a surface of the piezoelectric member and is a pair of interdigital transducer electrodes interdigitated with each other.

5. The electronic circuit device according to claim 4, wherein the pair of electrodes of the varistor element and the interdigital transducer electrodes are formed by patterning the same conductive film, the pair of electrodes of the varistor element is disposed spaced apart by a gap in an in-plane direction of the substrate, the varistor insulating film covers an area from an upper surface of one electrode to an upper surface of the other electrode via the gap, and the varistor element further includes an upper conductive film disposed on the varistor insulating film and facing via the varistor insulating film both of the electrodes of the varistor element.

6. A manufacture method for an electronic circuit device comprising steps of:
   (a) preparing a substrate having at least a surface layer made of piezoelectric material;
   (b) forming a conductive film of conductive material on the substrate;
   (c) patterning the conductive film to form a pair of interdigital transducer electrodes interdigitated with each other and a pair of varistor electrodes respectively continuous with the pair of interdigital transducer electrodes;
   (d) forming a varistor insulating film covering an area from an upper surface of one of the pair of varistor electrodes to an upper surface of the other of the pair of varistor electrodes; and
   (e) forming an upper conductive film on the varistor insulating film facing both of the electrodes via the varistor insulating film,
   wherein when a surge voltage is applied across the pair of varistor electrodes, a surge current flows through the varistor insulating film and the upper conductive film.

7. The manufacture method for an electronic circuit device according to claim 6, wherein in the step (d), the varistor insulating film is formed by forming an insulating film of strontium titanate by sputtering without positively heating the substrate.

* * * * *